United States Patent [19]

Vergnolle

[11] 3,715,677

[45] Feb. 6, 1973

[54] AMPLIFIERS OF HYBRID INTEGRATED SUBMINIATU-RISED CIRCUIT DESIGN

[75] Inventor: Claude Vergnolle, Paris, France

[73] Assignee: Thomson-CSF, Paris, France

[22] Filed: Jan. 28, 1971

[21] Appl. No.: 110,465

[30] Foreign Application Priority Data

Feb. 3, 1970 France ................................7003737

[52] U.S. Cl. .....................330/31, 330/34, 330/38 M, 330/53

[51] Int. Cl. ..............................................H03f 3/04

[58] Field of Search..330/21, 31, 34, 38 M, 53, 61 R, 330/61 A; 331/107 T, 96, 99

[56] References Cited

UNITED STATES PATENTS

| | | | |
|---|---|---|---|
| 3,402,361 | 9/1968 | Havens | 330/34 X |
| 3,503,000 | 3/1970 | Ivey | 330/31 X |
| 3,588,741 | 6/1971 | Glance | 331/99 X |

*Primary Examiner*—Roy Lake
*Assistant Examiner*—James B. Mullins
*Attorney*—Cushman, Darby & Cushman

[57] ABSTRACT

A tunnel diode or transistor amplifier in the form of a hybrid integrated circuit, whose gain bandwidth product is as large as possible. The amplifier comprises a circuit having a band-pass filter structure, whose coil elements form the linking structures.

4 Claims, 9 Drawing Figures

AMPLIFIERS OF HYBRID INTEGRATED SUBMINIATU-RISED CIRCUIT DESIGN

The present invention relates to improvements in amplifiers designed as hybrid integrated subdminiature circuits.

Hybrid integrated subminiature circuits, which are distinguished by their extremely tiny dimensions, are constituted by a substrate upon which there are formed passive electronic components such as inductors and capacitors, and semiconductor active components.

In these subminiature circuits, the semiconductor components are in the form of bare pills, in which form, there no housing or casing being used, they present no shunt capacitance and series inductance of the kind which are presented by the casing and external leads when these latter are used.

For this reason, the tunnel diode and transistor amplifiers produced by known methods in the form of hybrid subminiature circuits, normally have a much wider pass band than amplifiers produced using conventional components. However, despite this improvements, it may nevertheless happen that the bandwidth is still insufficient.

The amplifiers in accordance with the invention enable a gain pass-band product which is as high as possible, to be achieved, since they utilize a circuit with lumped capacitors and inductors, having the structure of a band-pass filter.

According to the invention, an amplifier system for ultra high frequencies comprises in combination : a conductive stud supporting a semiconductor device of the junction type, having at least a first and a second region of opposite types of conductivity, one of said regions being in contact with said stud, and a capacitor, having one of its electrodes in contact with said stud, a second capacitor, having a first electrode substantially in level with the other region and the other electrode and a second electrode ; a first metal wire connecting said first electrode with said other region ; a second metal wire connecting said other region and said other electrode ; a first and a second terminal for receiving an input signal and delivering an amplified output signal, said first terminal being connected to said second electrode ; and said stud connecting said second terminal to said one electrode and to said one region, said wires having lengths negligible with respect to the operating wave length, and building up with said capacitors and the capacitance of said junction, a band pass filter, having a center frequency substantially equal to the frequency to be amplified ; and means for connecting said system to a bias voltage source.

The invention will be better understood from a consideration of the ensuing description, given by way of non-limitative example and illustrated by the attached figures in which.

Figure 1:
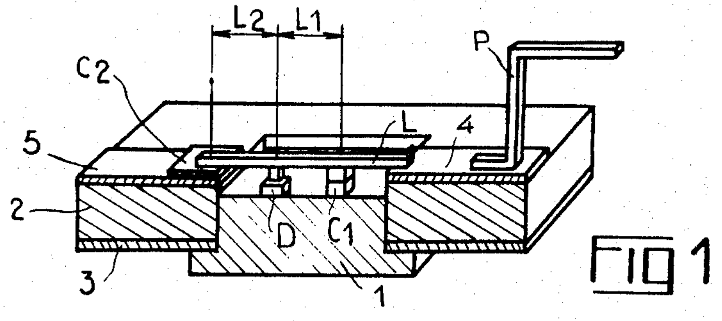
FIG. 1 is a perspective view of a tunnel diode amplifier system in accordance with the invention.

The amplifier system shown FIG. 1 comprises a substrate 2 of insulating material (ceramic, glass, quartz, etc) having an opening in which a metal stud 1 of gilded copper or gilded "kovar," is located ; at its bottom side, the stud 1 exhibits a flange by which it is soldered to a metallized film 3 covering the bottom face of the substrate 2. Diode D and the capacitor C1 are attached to the metal stud 1, being spaced away from one another in the longitudinal direction of the substrate. The diode D takes the form of a bare pill. The capacitor C1, for example of ceramic or MOS type (metal oxide semiconductor) has substantially the same dimensions as the diode. The height of the metal stud 1 is choosen so that the diode and the capacitor are level with the top face of the substrate 2. On this latter face, there are two longitudinal metallized strips 4 and 5 , located at the two sides of the hole through which the metal stud passes.

The strip 4 is located at the side corresponding with the capacitor C1 and the strip 5 at the side corresponding with the diode D. A miniaturized capacitor C2 has a lower electrode soldered to the end of the metallized strip 5. A straight conductor L, of the wire or strip type, electrically connects the strip portion 4, the other electrode of the capacitor C1, the diode D to the top armature of the capacitor C2. In FIG. 1, LI and L2 indicate those portions of the conductor L which connect the capacitor C1 to the diode D on the one hand, and the diode D to the strip portion 5 on the other. A connecting wire P, fixed to the portion of strip 4, is intended for the connection to a bias voltage source not shown.

Figure 2:
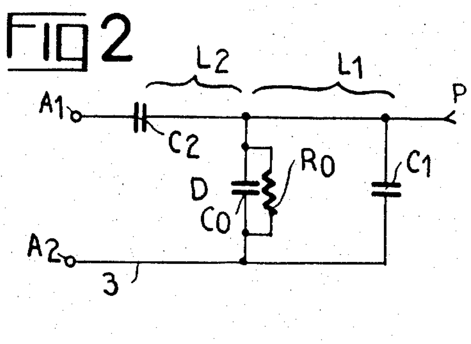
FIGS. 2 and 3 are equivalent circuit diagrams relating to the amplifier system of FIG. 1.
Figure 3:
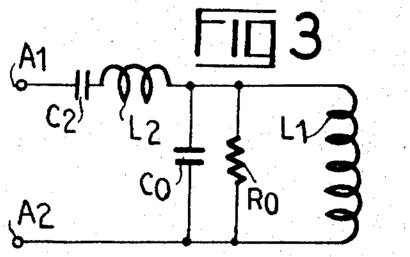

FIG. 2 illustrates the equivalent circuit diagram for the amplifier system of FIG. 1 and FIG. 3 is a simplification of the same diagram. In these diagrams, the tunnel diode is shown as a capacitor CO in parallel with a negative-resistance resistor RO. The capacitor CO is the capacitance of the diode junction. The resistance RO is the dynamic resistance presented by the tunnel diode when high frequency signal injected at the terminals A1, A2 is applied between the diode electrodes and when, at the same time, the potential applied to the wire P biases said diode in the forward sense to a point where the diode characteristic has the steepest possible negative slope, while retaining sufficient stability to prevent oscillations. The amplified output signal appears at the same terminals A1, A2 as the input signal. A circulator, not shown, can be used to separate the two signals. Generally, a quarter wave impedance transformer, (not shown), is arranged between the circulator and the input of the subminiature circuit, in order to adjust the gain of the amplifier.

It will be seen that the diode D is connected between the terminal A2 and the common terminal of the conductor sections L2, L1. The other terminal of conductor L2 is connected to the terminal A1 through the capacitor C2, whilst the other terminal of the conductor L1 is connected to the terminal A2 through the capacitor C1.

The diagram of FIG. 3 is equivalent to the diagram of FIG. 2 as far as the high frequency is concerned since the capacitor C1, which has been omitted has a negligible impedance at high frequencies. By contrast, the conductors are having inductive impedances elements and are illustrated in the form of coils carrying the same references L1,L2. As a matter of fact, the configuration of the diagram is that of a band pass filter.

In accordance with the invention, the dimensions of the conductors having the inductances L1 and L2 ( length as well as their width and thickness in the case of strips, their diameter in the case of wires), are selected so that their inductances L1 and L2 cooperating with the capacitance CO form a band pass filter whose center frequency coincides with the operating frequency of the amplifier.

Taking this into account and also the fact that the inductors $L1$, $L2$ are sections of a line of high wave impedance $Zc$ and lengths $L1$ and $L2$ of inductances $L1$ and $L2$ respectively which are short in relation to the operating wave length, having the effect that the respective impedance values $Z1 = (Zc)/(C)\ L1$ and $Z2 = Zc\ (L2)/(C)$ ($C$ = the velocity of light), the elements $L1$, $L2$ and C2 of the filter are calculated on the basis of the measured values RO, CO of the diode, using the theory of active filters.

Figure 4:
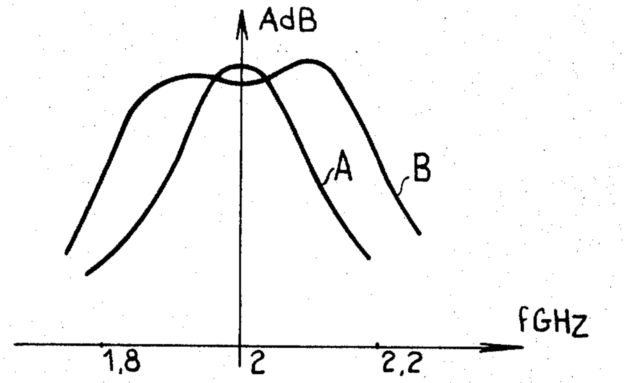
FIG. 4 illustrates characteristic curves relating to an amplifier in accordance with FIG. 1 and a conventional amplifier.

FIG. 4 illustrates two graphs of the gain A plotted in dB as a function of the frequency plotted in $Gc/s$ ; the curve A relates to a known kind of amplifier employing a tunnel diode in a casing, whilst curve B relates to an amplifier in accordance with the invention, in the form of a hybrid subminiature circuit.

In the prior art amplifier, the pass band is severly restricted since the casing of the diode introduces series inductance and shunt capacitance which, together with the junction capacitance, form a low-pass filter element.

In the amplifier in accordance with the invention, the improvement in band-width is due partly to the use of a tunnel diode in the form of a bare semiconductor pill, and partly to the band pass filter structure given to the amplifier, and also partly to the fact that the linking conductors $L1$, $L2$ behave as lumped constant coil elements. Elements of this kind allow an increase in bandwidth because they store more energy than the transmission lines, these being distributed constant elements, which are normally used. Moreover, they are not so bulky.

In this fashion, a tunnel diode amplifier whose gain/band width product is as large as possible, is obtained.

Moreover, the small size of the coil elements as well as the fact that the capacitors C1, C2 have the same dimensions as the diode D, make it possible to give all the components sufficiently small dimensions to enable the amplifier to be wholly assembled on the substrate of a hybrid integrated subminiature circuit.

Figure 5:
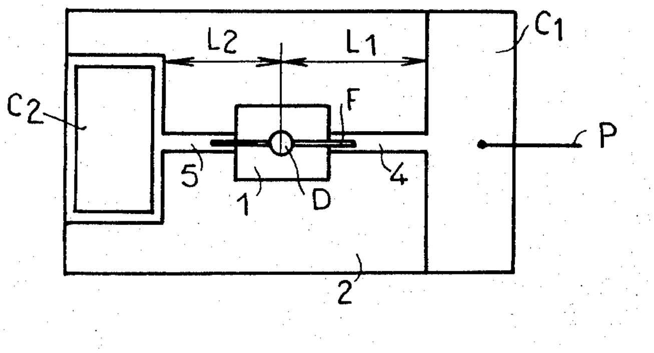
FIG. 5 is another embodiment of the amplifier in accordance with FIG. 1.

Variant embodiments are entirely possible of course. In FIG. 5, the input capacitor C2 is of thin-film design, the decoupling capacitor C1 is located away from the metal stud 1 at the end of the metallized strip portion 4 ; one of its is constituted by a metallized area on the top face of the substrate 1, whilst the other electrode is constituted by the earthed plane 3 and its dielectric constituted by the material of the substrate. The metal stud 1 simply carries the diode D. The diode D is connected to the metallized strips 4 and 5 and by means of a very fine wire F engraved in the alumina. This kind of very fine wire, which would not normally be capable of supporting itself, makes it possible to give the inductances Z1, Z2 relatively large values. The engraving can take a spiral form if it is desired to make the inductances even larger.

The variant embodiment shown in FIG. 5 is especially useful for relatively low frequency applications, for example decimetric wave lengths. However, at these frequencies, it may be advantageous to replace the tunnel diode by a low-noise transistor.

Figure 6:
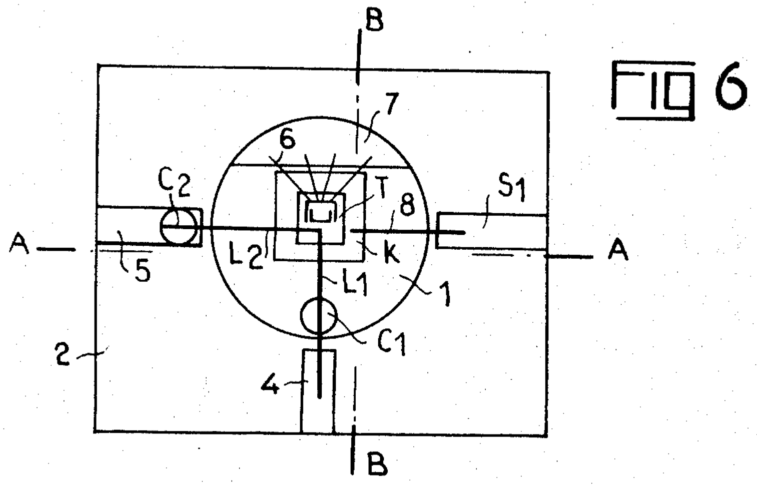
FIG. 6 is a plan view of a transistor amplifier system in accordance with the invention.
Figure 7:
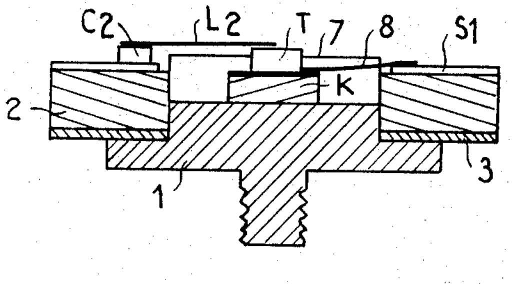
FIG. 7 is a section on the line A—A of the device of FIG. 6.
Figure 8:
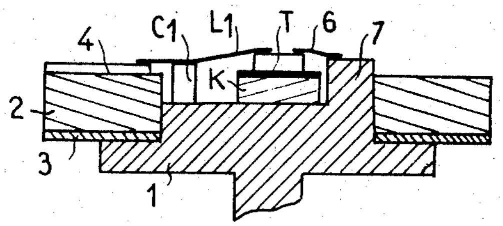
FIG. 8 is a section on the line B—B of the device of FIG. 6.

FIGS. 6,7 and 8 illustrate a transistor amplifier constituting another embodiment of the invention. The reference indices which have already been used in FIG. 1, will be used to designate elements which fulfil similar functions.

The transistor T is a planar transistor ; it is insulated from the metal stud by a pill K of dielectric material having low thermal resistance, such as beryllium oxide. The pill K is quite thick since it should not act as a capacitive element. Stud 1 will preferably be made of copper since it must dissipate heat.

The transistor T is illustrated by way of example in a common base amplifier type, one much used in power amplifiers.

The base of the transistor T is connected by several wires 6 to an excrescence 7 on the metal stud 1. In this fashion, the base is earthed by wires which are as short as possible. The emitter is connected, on the one hand to the input capacitor C2 by the conductor $L2$, and on the other hand to the decoupling capacitor by the conductor $L1$, the latter being prolonged beyond the capacitor for connection with the metallized strip 4. The capacitor C1 is of the MOS or ceramic type and is assembled on the metal stud 1 as in the case of FIG. 1. However, for reasons inherent in the design of a planar transistor, the metal strips 4 and 5 and consequently the capacitors C1,C2, are no longer in alignment with one another but at right angles to one another. The collector of the transistor T is connected by a wire 8 to a metallized strip S1.

In operation of this amplifier, the input signal is injected through the metallized strip 5. The bias is applied to the metal metallized 4. The output signal is taken between the metallized strip S1 and ground 3.

Figure 9:
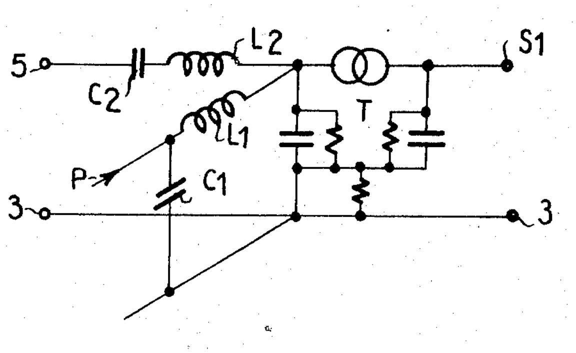
FIG. 9 is an equivalent circuit diagram relating to the amplifier system of FIG. 6.

FIGS. 9 illustrates the equivalent circuit diagram of the transistor amplifier shown in FIG. 6, 7 and 8. In this diagram, the same band-pass filter kind of arrangement as shown in the diagram of FIG. 3 relating to the amplifier of FIG. 1 with its tunnel diode, will be recognized. As before, the inductors $L1$, $L2$ of this arrangement are lumped constant coil elements constituted by conductors having the same reference indices. As before, the dimensions of these conductors are selected so that the central operating frequency of the band-pass-filter corresponds to operating frequency of the filter this making it possible to obtain a transistor amplifier whose gain/bandwidth product is as high as possible.

In the common base circuit of FIGS. 6, 7 and 8, the center frequency is based upon the capacitance CO of the input junction (emitter-base junction). Lumped constant tuning, produced quite simply through the medium of the linking conductors $L1$, $L2$, has a major advantage as far as bandwidth is concerned, because the input junction has a very low impedance especially where high power transistors are concerned.

It is possible to still further improve the amplifier qualities by additionally providing a similar arrangement at the output junction (base-collector junction). For this purpose, instead of connecting the collector of the transistor T to the out put S1 by a single wire 8 as in FIG. 8, it is merely necessary to provide two supplementary capacitors (not shown) one connected to the outlets 1 and the other to the metal stud 1, both connected to the collector by means of wires of selected size.

Similar arrangements can equally be used with a transistor connected in a common emitter arrangement or common collector arrangement. It is well known that at very high frequencies, this latter arrangement is only suitable for oscillators although it can neverthless be used provided that it is borne in mind that in this case the planar transistor should be soldered directly to ground.

In the microwave range and for low-level amplifiers, the inductances required can reach a value such that if constituted by a wire, the wire would be too long and would have inadequate vibration resistance. In this case, it is advisable to engrave the inductances in a dielectric substrate in a manner similar to that already described in respect of the embodiment shown in FIG. 5, or in the form of a spiral.

The facility for using either thin film capacitors or capacitors having the same dimensions as the diodes as referred to hereinbefore in the case of the tunnel diode amplifier, is also available in the case of the transistor amplifier.

The amplifiers in accordance with the invention can be housed in sealed casings equipped with normal co-axial connections or subminiature co-axial connections. They can also be provided with pins or other means for connecting them to transmission lines of the "micro strip" or "triplate" type, for connection to a printed circuit. Several amplifiers can be produced on one and the same substrate.

The various metallizing and soldering operations required for the manufacturing of these amplifiers are carried out using current manufacturing techniques employed in the production of electronic devices.

These amplifiers find application in particular in radio relay equipment, portable radars, electronic scan radars, and so on.

What I claim, is:

1. An amplifier system for ultra high frequencies, comprising in combination: a conductive stud supporting a semiconductor device of the junction type having at least a first and a second region having respective types of conductivity, said first region being in contact with said stud ; and a capacitor having one of its electrodes in contact with said stud, and another electrode ; a second capacitor having a first electrode substantially in level with said second region, and the other electrode, and a second electrode ; a first metal wire connecting said first electrode with said second region ; a second metal wire connecting said second region and said other electrode : a first, a second and a third terminal, said first and second terminal receiving an input signal, and said second and one of said first and third terminals delivering an amplified output terminal ; said first terminal being connected to said second electrode, and means comprising said stud connecting said second terminal to said one electrode, and to said first region, said wires having lengths negligible with respect to the operating wavelength and building up with said capacitors and the capacitances of said junctions, a band pass filter, having a center frequency substantially equal to the frequency to be amplified ; and means for connecting said system to a bias source,

2. An amplifier as claimed in claim 1 further comprising a dielectric substrate, having a center hole and two sides, said stud being located in said hole, and means being provided for soldering said stud to said substrate, on one side of said substrate, the other side carrying two metallized strips constituting said first terminal and said second electrode, said second strip constituting said biassing means.

3. An amplifier system as claimed in claim 1, wherein said semiconductor device is a tunnel diode, said first and said second regions forming junction and having opposite types of conductivity, said first and said second terminal delivering said output signal.

4. An amplifier system as claimed in claim 1, wherein said semiconductor is a junction transistor, said first and said second regions being of opposite types of conductivity and forming respectively an emitter and a base for said transistor, a third region of of the type of conductivity of said first region, underneath said second region, and forming the collector of said transistor ; means for connecting said collector to said third terminal, said base to said stud, said second wire connecting said emitter to said other electrode of said second capacitor, the input signal being applied to said first and said second terminal, means being provided, for collecting the output signal, at said second and third terminals.

* * * * *